(12) United States Patent
Kirkwood et al.

(10) Patent No.: US 10,179,940 B2
(45) Date of Patent: Jan. 15, 2019

(54) HARDENED TITANIUM STRUCTURE FOR TRANSMISSION GEAR APPLICATIONS

(71) Applicant: The Boeing Company, Chicago, IL (US)

(72) Inventors: Brad L. Kirkwood, Kent, WA (US); Marc R. Matsen, Seattle, WA (US); Tony Shen, Phoenix, AZ (US); Wesley B. Crow, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 271 days.

(21) Appl. No.: 14/942,997

(22) Filed: Nov. 16, 2015

(65) Prior Publication Data

US 2016/0068922 A1  Mar. 10, 2016

Related U.S. Application Data

(62) Division of application No. 12/369,157, filed on Feb. 11, 2009, now Pat. No. 9,187,818.

(51) Int. Cl.
    *C21D 1/42* (2006.01)
    *C21D 1/10* (2006.01)
    (Continued)

(52) U.S. Cl.
    CPC .............. *C21D 1/42* (2013.01); *B21K 29/00* (2013.01); *B23F 17/006* (2013.01); *C21D 1/10* (2013.01); *C21D 1/60* (2013.01); *C21D 1/613* (2013.01); *C21D 1/62* (2013.01); *C21D 1/74* (2013.01); *C21D 6/00* (2013.01); *C21D 6/02* (2013.01); *C21D 9/32* (2013.01); *C21D 10/005* (2013.01); *C22F 1/10* (2013.01); *C22F 1/183* (2013.01); *C23C 14/06* (2013.01);
    (Continued)

(58) Field of Classification Search
    CPC ..... B21K 29/00; B23F 17/006; C21D 10/005; C21D 1/10; C21D 1/42; C21D 1/60; C21D 1/613; C21D 1/62; C21D 1/74; C21D 2211/004; C21D 6/00; C21D 6/02; C21D 9/32; C22F 1/10; C22F 1/183; C23C 14/06
    USPC ................................... 219/639, 640; 266/129
    See application file for complete search history.

(56) References Cited

U.S. PATENT DOCUMENTS 1,939,712 A    12/1933 Mahoux
2,444,259 A *   6/1948 Jordan ..................... C21D 9/32
                                                        148/573

(Continued)

OTHER PUBLICATIONS

Notice of Allowance, dated Aug.25, 2016, regarding U.S. Appl. No. 13/936,207, 11 pages.

(Continued)

*Primary Examiner* — Ibrahime A Abraham
*Assistant Examiner* — Frederick Calvetti
(74) *Attorney, Agent, or Firm* — Yee & Associates, P.C.

(57) ABSTRACT

A method and apparatus are present for manufacturing a part. The part is comprised of a metal alloy and is positioned to form a positioned part. An electromagnetic field is generated that heats the positioned part. A surface of the positioned part is exposed to an inert gas, while the electromagnetic field is generated to create an inverse thermal gradient between an exterior of the positioned part and an interior section of the positioned part to form a heat treated part.

22 Claims, 8 Drawing Sheets

(51) Int. Cl.

| | | |
|---|---|---|
| C21D 6/02 | (2006.01) | |
| C21D 9/32 | (2006.01) | |
| C21D 10/00 | (2006.01) | |
| C22F 1/10 | (2006.01) | |
| C22F 1/18 | (2006.01) | |
| C23C 14/06 | (2006.01) | |
| B21K 29/00 | (2006.01) | |
| B23F 17/00 | (2006.01) | |
| C21D 1/60 | (2006.01) | |
| C21D 1/613 | (2006.01) | |
| C21D 1/62 | (2006.01) | |
| C21D 1/74 | (2006.01) | |
| C21D 6/00 | (2006.01) | |

(52) U.S. Cl.
CPC ....... *C21D 2211/004* (2013.01); *Y02P 10/253* (2015.11); *Y10T 29/4948* (2015.01)

(56) References Cited

U.S. PATENT DOCUMENTS

| | | | |
|---|---|---|---|
| 4,251,704 A | 2/1981 | Masie et al. | |
| 4,448,633 A | 5/1984 | Shuskus | |
| 4,675,488 A | 6/1987 | Mucha et al. | |
| 4,757,170 A | 7/1988 | Mucha et al. | |
| 4,894,501 A | 1/1990 | Pfaffmann et al. | |
| 4,902,359 A | 2/1990 | Takeuchi et al. | |
| 5,221,513 A | 6/1993 | Amateau et al. | |
| 5,331,127 A | 7/1994 | Chen | |
| 5,391,862 A * | 2/1995 | Amateau | B23P 15/14 219/640 |
| 5,447,580 A * | 9/1995 | Semiatin | C21D 1/06 148/421 |
| 5,451,275 A | 9/1995 | Amateau et al. | |
| 5,466,305 A | 11/1995 | Sato et al. | |
| 5,527,020 A * | 6/1996 | Ganesh | C21D 9/38 266/258 |
| 5,656,106 A | 8/1997 | Amateau et al. | |
| 5,767,628 A | 6/1998 | Keller et al. | |
| 5,799,398 A | 9/1998 | Amateau et al. | |
| 5,994,678 A * | 11/1999 | Zhao | C23C 16/4586 118/722 |
| 6,007,762 A | 12/1999 | Amateau et al. | |
| 6,051,286 A * | 4/2000 | Zhao | C23C 16/4401 118/723 E |
| 6,059,898 A | 5/2000 | Fisher et al. | |
| 6,126,892 A | 10/2000 | Amateau et al. | |
| 6,289,033 B1 * | 9/2001 | Tipton | H05B 6/103 219/651 |
| 6,576,877 B2 | 6/2003 | Dabelstein et al. | |
| 7,161,124 B2 | 1/2007 | Kisner et al. | |
| 7,641,850 B2 | 1/2010 | Sontti et al. | |
| 8,496,872 B1 | 7/2013 | Weires et al. | |
| 2004/0219051 A1 | 11/2004 | Sonti et al. | |
| 2006/0231549 A1 * | 10/2006 | Kisner | H05B 6/101 219/635 |
| 2009/0020525 A1 * | 1/2009 | Loveless | H05B 6/405 219/640 |
| 2010/0200123 A1 | 8/2010 | Kirkwood et al. | |
| 2013/0292007 A1 | 11/2013 | Weires et al. | |

OTHER PUBLICATIONS

Office Action, dated Aug. 4, 2011, regarding U.S. Appl. No. 12/369,157, 28 pages.
Final Office Action, dated Jan. 17, 2012, regarding U.S. Appl. No. 12/369,157, 22 pages.
Office Action, dated Oct. 17, 2012, regarding U.S. Appl. No. 12/839,647, 27 pages.
Final Office Action, dated Feb. 4, 2013, regarding U.S. Appl. No. 12/839,647, 12 pages.
Notice of Allowance, dated Mar. 26, 2013, regarding U.S. Appl. No. 12/839,647, 10 pages.
Office Action, dated Jul. 25, 2014, regarding U.S. Appl. No. 12/369,157, 29 pages.
Final Office Action, dated Feb. 12, 2015, regarding U.S. Appl. No. 12/369,157, 23 pages.
Notice of Allowance, dated Jul. 10, 2015, regarding U.S. Appl. No. 12/369,157, 7 pages.
Office Action, dated Mar. 24, 2016, regarding U.S. Appl. No. 13/936,207, 21 pages.

* cited by examiner

HARDENED TITANIUM STRUCTURE FOR TRANSMISSION GEAR APPLICATIONS

This application is a divisional application of U.S. patent application Ser. No. 12/369,157, filed Feb. 11, 2009.

BACKGROUND INFORMATION

1. Field

The present disclosure relates generally to manufacturing parts and, in particular, to a method and apparatus for manufacturing hardened metallic structures. Still more particularly, the present disclosure relates to a method and apparatus for manufacturing a precipitation hardened metal alloy structure for transmission gear applications.

2. Background

A gear is a component that may be found within a transmission system that may transmit rotational force to another gear and/or device. A gear may take the form of a rounded wheel with teeth. The teeth may engage and/or mesh with other teeth on another gear and/or device. This engagement may allow for force to be transferred from one gear to another gear and/or device without slippage.

Gears are commonly found in various vehicles, such as an aircraft. In particular, a helicopter has a number of different transmission systems in which gears are used. For example, without limitation, a helicopter has one or more of an engine nose transmission box, an intermediate gear transmission box, a main transmission gear box, a tail rotor transmission box, or some other suitable gear system.

Gears for industrial and/or aerospace applications typically have a strong, tough core. This core is designed to be resistant to crack propagation and roller fatigue failure. The surface of a gear typically has a strong, hard layer that forms the teeth for the gear. This surface is designed to be resistant to wear that can occur from the surface of the teeth of the gear sliding against teeth on another gear and/or device.

These properties for gears are achieved using various types of metals and/or metal alloys. For example, without limitation, steel alloys are processed by quenching and tempering steel alloys followed by nitrating of the alloys. In addition to having these types of properties, it also is desirable to decrease the weight of gears, especially for use in aerospace applications. For example, without limitation, gears in a helicopter transmission may form around one third of the weight of the systems.

One solution is to use a titanium gear. A titanium gear has a lower density as compared to steel alloys, resulting in a lower weight. Currently available titanium alloy gears, however, have a lower strength than a steel alloy gear with similar dimensions. For example, without limitation, gears made from widely available titanium alpha-beta alloys, such as Ti-6Al-4V or Ti-6Al-2Sn-4V-2Zr, have a strength that is one third less than a steel alloy gear.

To compensate for this type of strength difference, a titanium alloy gear may be thicker to compensate for the lower strength. This compensation, however, often reduces the weight savings enabled by the lower density of titanium alloys, to near zero. Further, titanium alloy gears also have surfaces that are not as hard as the surfaces of steel alloy gears with respect to resisting sliding wear when engaging other gears.

Therefore, it would be advantageous to have a method and apparatus that takes into account one or more of the issues discussed above, as well as possibly other issues.

SUMMARY

In one advantageous embodiment, a method is present for manufacturing a part. The part is comprised of a metal alloy and is positioned to form a positioned part. An electromagnetic field is generated that heats the positioned part. A surface of the positioned part is exposed to an inert gas while the electromagnetic field is generated to create an inverse thermal gradient between an exterior of the positioned part and an interior section of the positioned part to form a heat treated part.

In another advantageous embodiment, a method for manufacturing a gear is present. A plate comprised of a metal alloy is forged in a beta phase region. The metal alloy is selected from one of precipitation hardening metal alloys, metastable beta titanium alloys, precipitation hardenable stainless steel alloys, and nickel base superalloys. The plate is a gear and is forged in an alpha plus beta phase region to form a forged gear shape after forging the gear in the beta phase region. The forged gear shape is solution heat treated in the beta phase region after forging the forged gear shape in the alpha plus beta phase region. The forged gear shape is cooled in an alpha phase region. The cooling is performed using one of air cooling and water quenching to prevent an alpha phase precipitation. The forged gear shape is machined to form the gear. The gear is positioned on a part holder relative to an induction coil to form a positioned gear. The part holder, a cooling ring manifold, and the induction coil are located in a chamber. An electromagnetic field is generated with the induction coil. The electromagnetic field has a frequency from around one hertz to around 10,000 hertz and an intensity that generates eddy currents in the positioned gear to heat the positioned gear to a selected temperature in the alpha plus beta phase region in which precipitation hardening occurs. The frequency is selected based on a depth of the gear. Tooth surfaces of the positioned gear are exposed to an inert gas, while generating the electromagnetic field to create an inverse thermal gradient between an exterior section of the positioned gear and an interior section of the positioned gear to form a heat treated gear. The heat treated gear has a graded precipitation hardened microstructure, and the exterior section of the heat treated gear is harder than the interior section of the heat treated gear. The heat treated gear is ground. Laser shock peening is performed on a surface of the heat treated gear to place the surface of the heat treated gear into compressive stress. A coating is deposited on the tooth surfaces of the gear to form coated tooth surfaces. The coating comprises a material selected from one of physical vapor deposition titanium nitride, plated nickel carbide, and high velocity oxygen fuel deposited tungsten carbide-cobalt. The coated tooth surfaces of the gear are polished. The gear is capable of being used in an object selected from one of a mobile platform, a stationary platform, a land-based structure, an aquatic-based structure, a space-based structure, an aircraft, a helicopter, a surface ship, a tank, a personnel carrier, a train, a spacecraft, a submarine, a bus, a car, a race car, a race boat, a machine press, a transmission, a dam, and a manufacturing facility.

In yet another advantageous embodiment, an apparatus comprises a chamber, an induction coil, and a gas delivery system. The induction coil is capable of generating an electromagnetic field located in the chamber. The gas delivery system may is capable of continuously delivering an inert gas onto a surface of a part in the chamber while the electromagnetic field is generated, such that an inverse thermal gradient is established in the part.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

Figure 1:
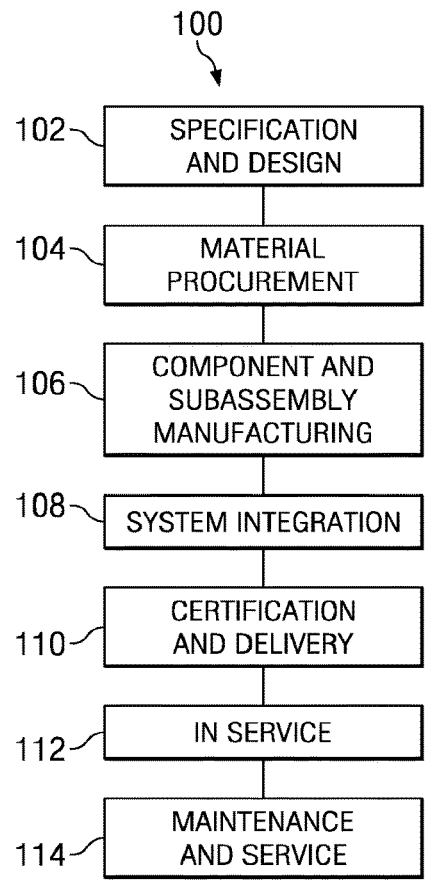
FIG. 1 is a diagram illustrating an aircraft manufacturing and service method in accordance with an advantageous embodiment.
Figure 2:
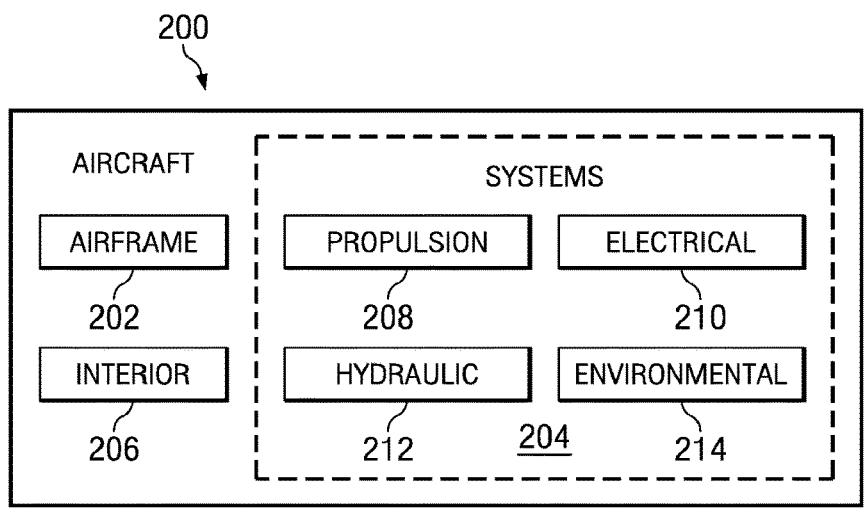
FIG. 2 is a diagram of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, a diagram illustrating an aircraft manufacturing and service method is depicted in accordance with an advantageous embodiment. During pre-production, exemplary aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, a diagram of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, and environmental system 214. Aircraft 200 may take various forms. For example, aircraft 200 may be an airplane, a helicopter, or some other suitable type of aircraft. Any number of other systems may be included. Although an aerospace example is shown, different advantageous embodiments may be applied to other industries, such as the automotive industry.

Apparatus and methods embodied herein may be employed during any one or more of the stages of aircraft manufacturing and service method 100 in FIG. 1. For example, components or subassemblies produced in component and subassembly manufacturing 106 in FIG. 1 may be fabricated or manufactured in a manner similar to components or subassemblies produced while aircraft 200 is in service 112 in FIG. 1.

Also, one or more apparatus embodiments, method embodiments, or a combination thereof may be utilized during production stages, such as component and subassembly manufacturing 106 and system integration 108 in FIG. 1, for example, without limitation, by substantially expediting the assembly of or reducing the cost of aircraft 200. Similarly, one or more of apparatus embodiments, method embodiments, or a combination thereof may be utilized while aircraft 200 is in service 112 or during maintenance and service 114 in FIG. 1.

The different advantageous embodiments take into account and recognize that is desirable to have a lightweight material that may be used to manufacture parts, such as gears. The different advantageous embodiments recognize and take into account that it is desirable to have a gear that has an interior that may avoid fracturing when carrying loads, such as those from a shaft on which the gear may be mounted.

The different advantageous embodiments also take into account and recognize that it is desirable to have a gear with an exterior that is sufficiently hard to resist wear when engaging other gears. Further, the different advantageous embodiments recognize and take into account that it is desirable to have gears with surfaces capable of engaging other gears in a manner that allows for improved friction resistance in addition to improved wear.

Thus, the different advantageous embodiments provide a method for manufacturing a part. A part comprised of a metal alloy is positioned. An electromagnetic field is generated that heats the positioned part. Further, a surface of the positioned part is exposed to an inert gas, while the electromagnetic field is generated to create a thermal gradient between the surface of the positioned part and the interior of the positioned part to form a heat treated part.

Figure 3:
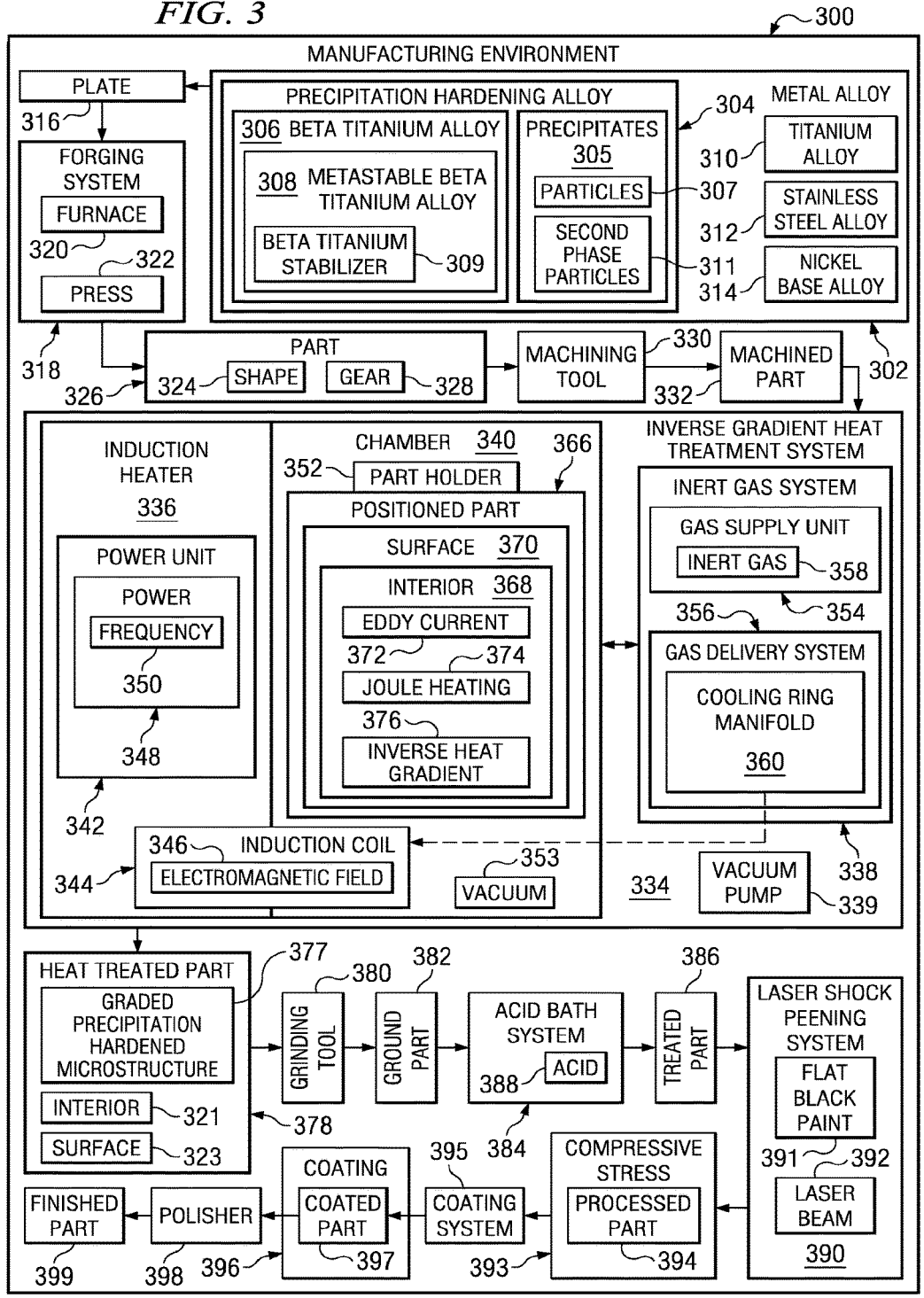
FIG. 3 is a block diagram of a manufacturing environment in accordance with an advantageous embodiment.

With reference now to FIG. 3, a block diagram of a manufacturing environment is depicted in accordance with an advantageous embodiment. Manufacturing environment 300 may be used to manufacture parts for an aircraft such as, for example, aircraft 200 in FIG. 2.

In this illustrative example, manufacturing environment 300 is used to process metal alloy 302. Metal alloy 302 may take various forms. For example, without limitation, metal alloy 302 may be precipitation hardening alloy 304. In other words, metal alloy 302 may be selected as one that may be strengthened and/or hardened through precipitation hardening. Precipitation hardening alloy 304 is a metal alloy capable of being thermally processed to form precipitates 305.

Precipitates 305 strengthen precipitation hardening alloy 304 in these illustrative examples. Precipitation hardening is a thermal process in which precipitates such as for example, without limitation, particles 307, are created from a supersaturated solid solution phase of the precipitation hardening alloy 304. A supersaturated solid solution phase is a phase in which a solution contains more of the dissolved particles than can be dissolved in the solution. These particles are also referred to as second phase particles 311.

Precipitates 305 increase strength and hardness in precipitation hardening alloy 304. Precipitates 305 may impede movement of dislocations and/or defects in a crystal lattice for precipitation hardening alloy 304. Precipitates 305 are formed at a temperature where the precipitated particles are thermodynamically stable. Precipitates 305 may be, for example, without limitation, particles 307 and/or second phase particles 311.

In these depicted examples, precipitation hardening alloy 304 is, for example, without limitation, beta titanium alloy 306. Beta titanium alloy 306 takes the form of metastable beta titanium alloy 308 in these examples. Metastable beta titanium alloy 308 may include beta titanium stabilizer 309. Beta titanium stabilizer 309 is any element capable of stabilizing the high temperature beta phase of metastable beta titanium alloy 308 to lower temperatures. For example, without limitation, beta titanium stabilizer 309 may be molybdenum (Mo), vanadium (V), niobium (Nb), chromium (Cr), and/or iron (Fe).

Metal alloy 302 may include, for example, without limitation, titanium alloy 310, stainless steel alloy 312, nickel base alloy 314, and other suitable precipitation hardenable metal alloys. Titanium alloy 310 may be, for example, any metastable beta titanium alloy. Stainless steel alloy 312 and nickel base alloy 314 may be implemented using any precipitation hardened stainless steel alloy and any precipitation hardened nickel base alloy, respectively. In these illustrative examples, titanium alloy 310 may be, for example, without limitation, Ti-10V-2Fe-3Cr, Ti-5Mo-5V-5Al-3Cr, Ti-4.5Fe-6.8Mo-1.5Al, and/or any other suitable beta titanium alloys.

Metal alloy 302 takes the form of plate 316. Plate 316 may have various shapes. For example, plate 316 may be circular, rectangular, square, and/or some other suitable shape. Further, plate 316 may have various thicknesses depending on the particular implementation. Plate 316 is processed within forging system 318 in these examples.

In this illustrative example, forging system 318 may include furnace 320 and press 322. Furnace 320 heats plate 316 to allow plate 316 to be shaped using press 322. Press 322 shapes plate 316 into shape 324 of part 326. Part 326, in these examples, may be, for example, without limitation, gear 328.

Machining tool 330 machines shape 324 into dimensions for part 326 to form machined part 332. Machining tool 330 may be any machining tool capable of creating desired dimensions for part 326. Machining tool 330 may be, for example, without limitation, a planing tool, a milling tool, a drilling tool, a grinding tool, a polishing tool, and/or some other combination of tools.

Machined part 332 is processed using inverse gradient heat treatment system 334. In the depicted examples, inverse gradient heat treatment system 334 is used to perform precipitation hardening of precipitation hardening alloy 304 within machined part 332. Inverse gradient heat treatment system 334 is used to perform ageing and/or age hardening to further control the final structure and resulting mechanical properties of machined part 332.

Inverse gradient heat treatment system 334 comprises induction heater 336, inert gas system 338, vacuum pump 339, and chamber 340. Induction heater 336 includes power unit 342 and induction coil 344. Power unit 342 may include, for example, without limitation, capacitors, transformers, and/or other suitable devices. Induction coil 344 is located within chamber 340 and also is also referred to as an inductor in the depicted examples.

Power unit 342 is capable of generating power 348 with different frequencies. For example, without limitation, power unit 342 generates power 348 with frequency 350. Power 348 is sent to induction coil 344 to generate electromagnetic field 346. In these examples, frequency 350 may vary from around one hertz to around 10,000 hertz. The frequency used and the frequencies that may be achieved vary, depending on the implementation for power unit 342. Power unit 342 supplies cooling water to induction coil 344 to keep induction coil 344 at lower temperatures for less resistive losses.

Part holder 352 is present within chamber 340. Vacuum pump 339 creates vacuum 353 within chamber 340. Inert gas system 338 includes gas supply unit 354 and gas delivery system 356. Gas supply unit 354 may store inert gas 358 for delivery by gas delivery system 356 into chamber 340.

Vacuum pump 339 creates vacuum 353 in chamber 340. Gas delivery system 356 delivers inert gas 358 into chamber 340 with vacuum 353. Vacuum pump 339 creates vacuum 353. This process may be repeated some number of times before processing positioned part 366.

In this depicted example, gas delivery system 356 takes the form of cooling ring manifold 360. Cooling ring manifold 360 may be formed from a tube that is brazed or welded to induction coil 344 after induction coil 344 has been cooled. Cooling ring manifold 360 may be comprised of materials that are good conductors of heat and electricity. For example, without limitation, copper and copper alloys that have low electrical resistivity may be used to form cooling ring manifold 360.

Machined part 332 is positioned within chamber 340 on part holder 352 as positioned part 366. When power 348 at frequency 350 is applied to induction coil 344, electromagnetic field 346 heats positioned part 366. This heating occurs in interior 368 rather than at surface 370 and diffusing into interior 368 of positioned part 366.

Eddy current 372 is generated by electromagnetic field 346 in interior 368 of positioned part 366 in the depicted examples. Eddy current 372 causes Joule heating 374 in interior 368 of positioned part 366. Surface 370 of positioned part 366 is exposed to inert gas 358 in the form of a jet of inert gas 358 flowing on surface 370.

While electromagnetic field 346 is generated by cooling ring manifold 360, inert gas 358 is delivered onto surface 370 of positioned part 366 through cooling ring manifold 360. Inert gas 358 may cool surface 370 of positioned part 366. In the depicted examples, surface 370 is continuously exposed to inert gas 358 for some period of time while the heating occurs. The period of time may be the entire time electromagnetic field 346 is applied to positioned part 366, or some portion of time while electromagnetic field 346 is applied to positioned part 366 during and after application of electromagnetic field 346 to positioned part 366.

This heating and cooling is performed to create inverse thermal gradient 376. Inverse thermal gradient 376 has increasing temperature farther into interior 368 as compared to surface 370.

This processing of positioned part 366 forms heat treated part 378, which is a result of precipitation hardening of precipitation hardening alloy 304 in positioned part 366. Thereafter, heat treated part 378 is processed using grinding tool 380. In this example, heat treated part 378 has graded precipitation hardened microstructure 377. Graded precipitation hardened microstructure 377 is a change in the amount and/or sizes of precipitates within heat treated part 378.

In the illustrative examples, the amount of precipitation increases, and the size of the precipitates decrease outwards from surface 323 of heat treated part 378 as opposed to into interior 321 of heat treated part 378.

Grinding tool 380 grinds heat treated part 378 to desired dimensions to form ground part 382. Ground part 382 is processed using acid bath system 384 to form treated part 386.

Acid bath system 384 processes ground part 382 to remove any metal damage caused by grinding and heat treatment of heat treated part 378. In these examples, acid bath system 384 employs acid 388 such as, for example, without limitation, nitric acid ($HNO_3$) and hydrofluoric acid (HF).

Treated part 386 is processed using laser shock peening system 390. Laser shock peening system 390 coats treated part 386 with flat black paint 391 and then applies laser beam 392 to vaporize flat black paint 391. The laser vaporization of flat black paint 391 may be performed under a water layer. This process induces compressive stress 393 on and/or around surface 370 of treated part 386. Compressive stress 393 may help prevent fatigue that may occur during use of treated part 386.

In these examples, laser shock peening system 390 may employ any laser capable of inducing a desired amount of compressive stress on treated part 386.

Processed part 394 is then processed using coating system 395. Coating system 395 forms coating 396 on processed part 394 to form coated part 397.

Coating 396 provides improved wear and friction resistance. In these examples, coating 396 may take various forms. For example, without limitation, coating 396 may be comprised of materials selected from one physical vapor deposition titanium nitride, plated nickel carbide, and/or high velocity oxygen fuel deposited tungsten carbide-cobalt.

Coated part 397 may be polished using polisher 398 to form finished part 399. Finished part 399 may then be used within aircraft 200 in FIG. 2 or in some other suitable object using gears.

The illustration of manufacturing environment 300 in FIG. 3 is not meant to imply physical or architectural limitations to the manner in which different advantageous embodiments may be implemented. Other components in addition to, or in place of, the ones illustrated in manufacturing environment 300 may be used. Further, some components in manufacturing environment 300 may be omitted.

For example, without limitation, in some advantageous embodiments, a hammer system may be used in place of press 322 in forging system 318. In yet other advantageous embodiments, a hammer system may be used in conjunction with press 322. As yet another illustrative example, in some advantageous embodiments, additional induction heaters, in addition to induction heater 336, may be present to process multiple parts.

Further, in some advantageous embodiments, forging system 318 may be unnecessary. With this type of implementation, manufacturing environment 300 may begin with a partially completed part. In yet other advantageous embodiments, polisher 398 may be unnecessary, depending on the type of material used for coating 396.

Figure 4:
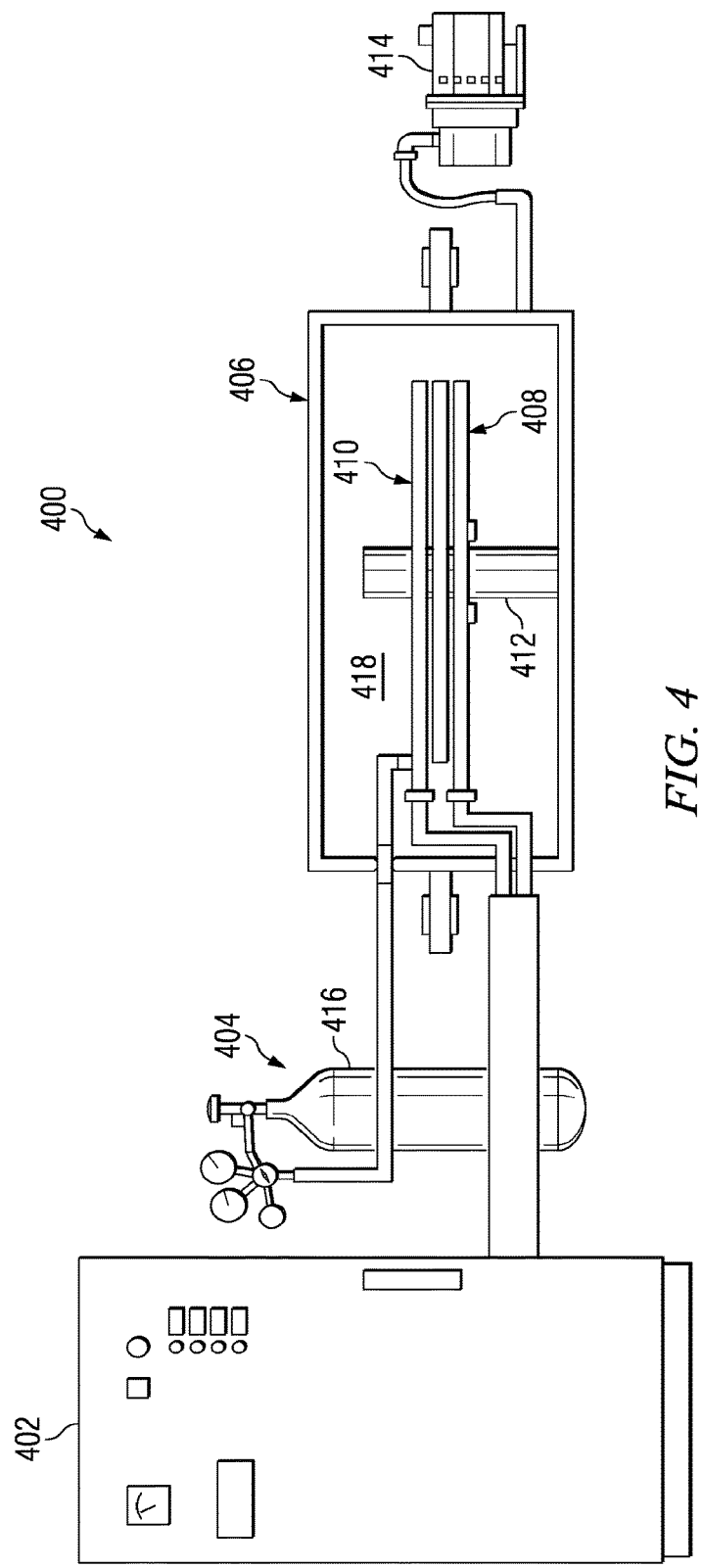
FIG. 4 is a diagram of an inverse gradient heat treatment system in accordance with an advantageous embodiment.

With reference now to FIG. 4, a diagram of an inverse gradient heat treatment system is depicted in accordance with an advantageous embodiment. In this example, inverse gradient heat treatment system 400 is an example of one implementation for inverse gradient heat treatment system 334 in FIG. 3.

In this illustrative example, inverse gradient heat treatment system 400 includes power supply 402, inert gas supply 404, chamber 406, induction coil 408, cooling ring manifold 410, part holder 412, and vacuum pump 414. Inert gas supply 404 is connected to cooling ring manifold 410, which is nested within induction coil 408. Induction coil 408 is connected to power supply 402.

Inert gas supply 404 supplies inert gas 416 into interior 418 of chamber 406, while induction coil 408 generates an electromagnetic field. Vacuum pump 414 creates a vacuum within chamber 406. Further, vacuum pump 414 also removes inert gas 416 in this illustrative example. Vacuum pump 414 also removes inert gas 416 to reduce and/or avoid pressurization of chamber 406.

Figure 5:
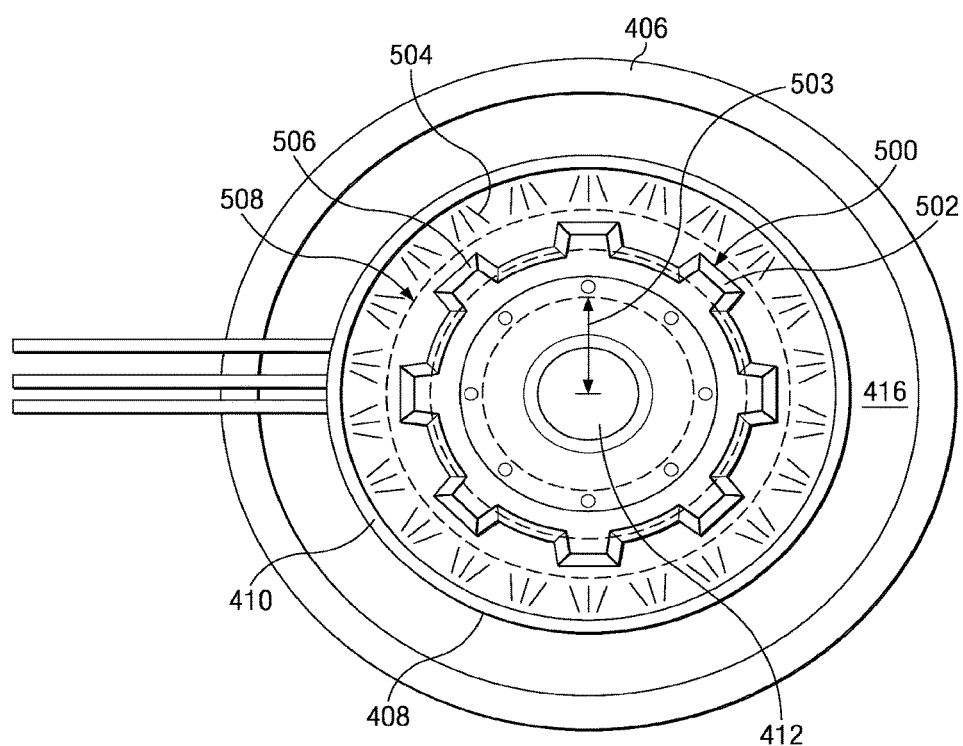
FIG. 5 is a diagram of a cross-sectional top view of a chamber in an inverse gradient heat treatment system in accordance with an advantageous embodiment.

With reference now to FIG. 5, a cross-sectional top view of a chamber in an inverse gradient heat treatment system is depicted in accordance with an advantageous embodiment. Part 500 is an example of positioned part 366 in FIG. 3. In this example, part 500 takes the form of gear 502 and is positioned within interior 416 of chamber 406 on part holder 412. Inert gas 504 is distributed onto surface 506 of gear 502, while electromagnetic field 508 is generated to heat gear 502. Inert gas 504 may be an inert cooling gas. Surface 506 includes tooth surfaces of gear 502.

Figure 6:
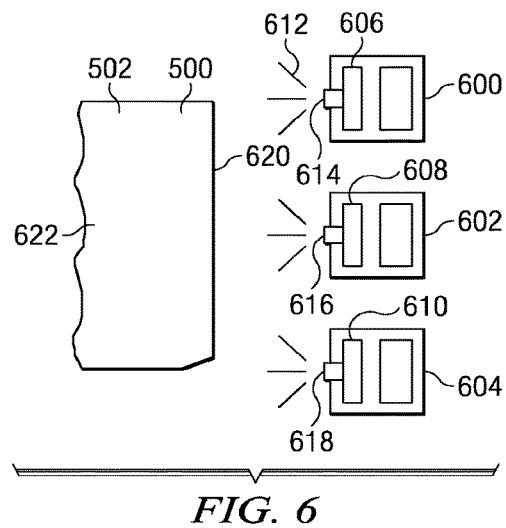
FIG. 6 is a diagram of a portion of a chamber with a gear in accordance with an advantageous embodiment.

With reference now to FIG. 6, a diagram of a portion of a chamber with a gear is depicted in accordance with an advantageous embodiment. In this depicted example, sections 600, 602, and 604 are portions of induction coil 408 seen in a cross-sectional view. As can be seen, sections 606, 608, and 610 are parts of a cooling ring manifold of the gas delivery system.

Inert gas 612 is delivered from openings 614, 616, and 618 to impinge on surface 620 of gear 502. These openings are also referred to as jets. Inert gas 612 cools surface 620, while interior 622 of gear 502 is heated by induction coil 408, shown as sections 600, 602, and 604.

Figure 7:
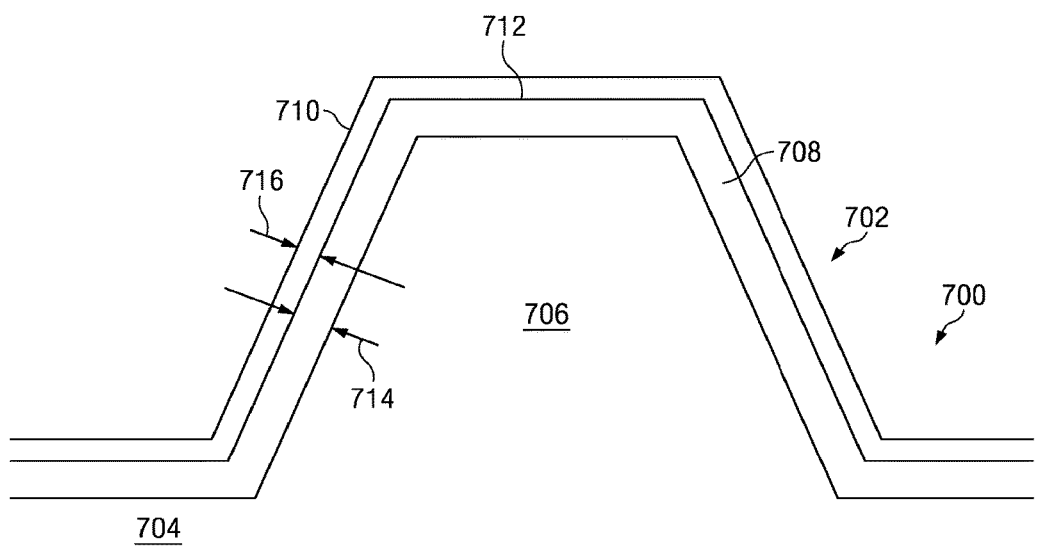
FIG. 7 is a diagram of a cross-sectional view of a portion of a gear in accordance with an advantageous embodiment.

With reference now to FIG. 7, a cross-sectional view of a portion of a gear is depicted in accordance with an advantageous embodiment. In this example, gear 700 is an example of a portion of finished part 399 in FIG. 3.

In this illustrative example, gear 700 has teeth 702 on wheel 704. As illustrated, gear 700 has interior section 706 and exterior section 708. Further, gear 700 also may have coating 710, which may be formed on surface 712 of gear 700.

In this illustrative example, exterior section 708 has H900 mechanical properties, while interior section 706 has H1050 mechanical properties. H1050 and H900, in this illustrative example, refer to an ageing heat treatment of one hour at temperatures of 1,050 and 900 degrees Fahrenheit respectively for a Ti-10V-2Fe-3Cr alloy.

In these illustrative examples, exterior section 708 has thickness 714, and coating 710 has thickness 716. Thickness 714 may typically be around 0.200 inches, and thickness 716 may typically be around 0.002 inches to around 0.020 inches in these examples.

Exterior section 708 is hardened or strengthened through precipitation hardening using inverse gradient heat treatment system 334 in FIG. 3. With exterior section 708 being hardened and/or strengthened relative to interior section 706, increased wear resistance may be present for gear 700.

Interior section 706 has a tougher interior as compared to exterior section 708. In other words, interior section 706 is capable of carrying loads in a manner that may avoid fracturing of gear 700. For example, wheel 704 may carry a load from a shaft on which gear 700 is mounted.

Figure 8:
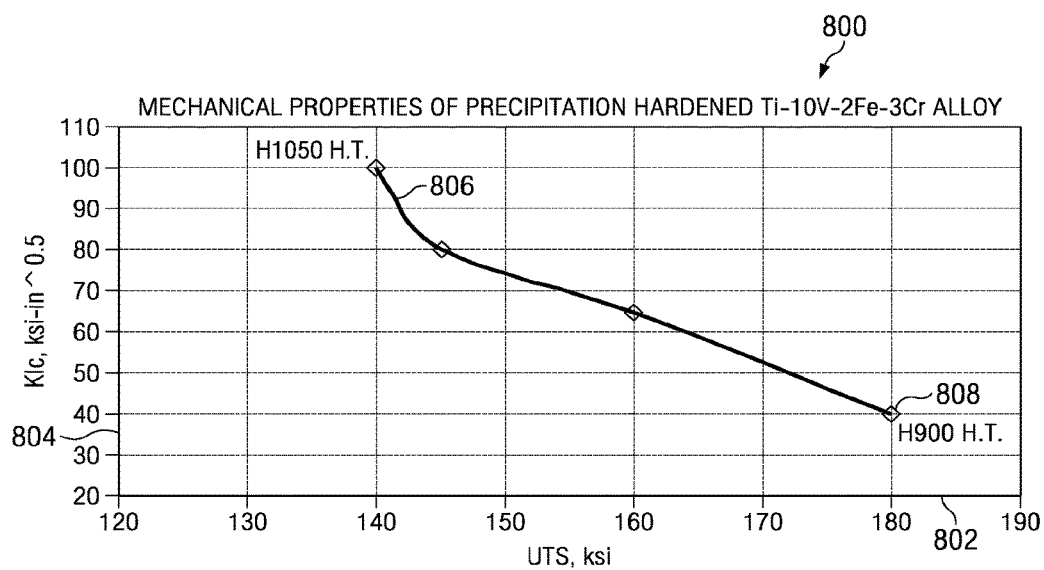
FIG. 8 is a diagram illustrating typical mechanical properties of a precipitation hardened Ti-10V-2Fe-3Cr alloy with various ageing treatments that may be used to fabricate a gear in accordance with an advantageous embodiment.

With reference now to FIG. 8, a diagram illustrating typical mechanical properties of a precipitation hardened Ti-10V-2Fe-3Cr alloy with various ageing treatments that may be used to fabricate a gear is depicted in accordance with an advantageous embodiment. In this illustrative example, graph 800 may represent core properties of gear 502 in FIG. 5 with a metastable beta titanium alloy. In this example, graph 800 may have x-axis 802, which represent ultimate tensile strength. Y-axis 804 represents fracture toughness.

As can be seen in this example, gear 502 has H1050 properties at point 806 in the interior of gear 502 and H900 properties at point 808 in the exterior section of gear 502. In this depicted example, the interior of gear 502 has a strength and/or toughness capable of resisting crack formation and propagation. In other words, the properties of the interior of gear 502 resist fracturing. The hardness at the surface of the gear reduces scratching, sliding, adhesive wear, and/or other types of wear that may occur on the surface of the gear.

Figure 9:
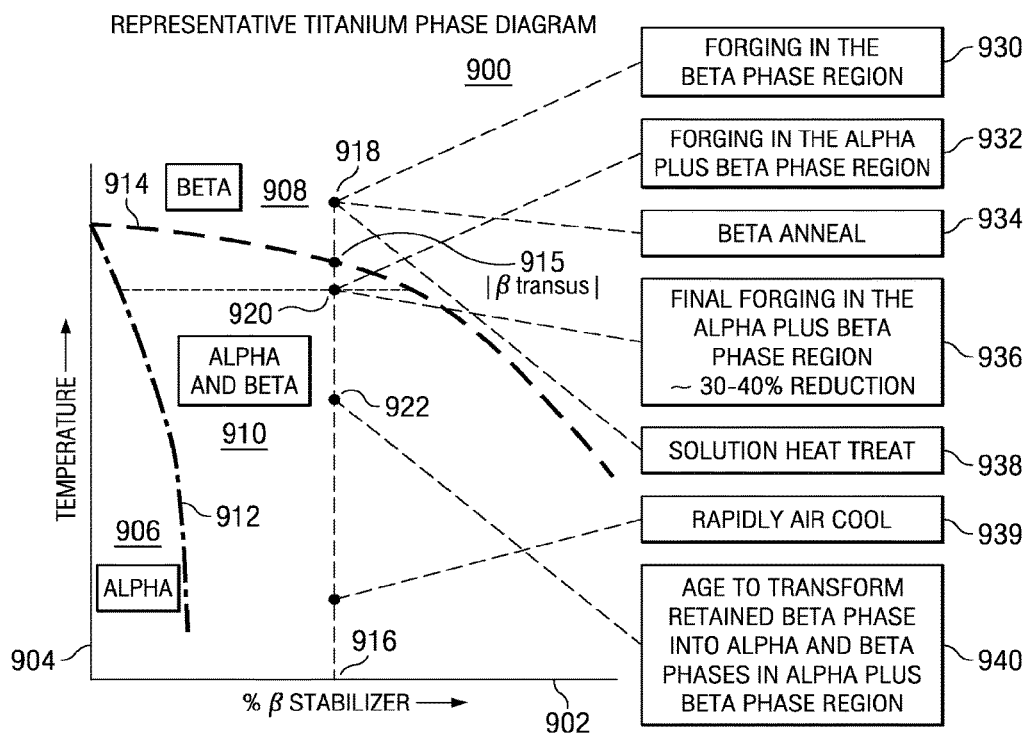
FIG. 9 is a diagram illustrating a manufacturing sequence for a titanium alloy in accordance with an advantageous embodiment.

With reference now to FIG. 9, a diagram illustrating a manufacturing sequence for a titanium alloy is depicted in accordance with an advantageous embodiment. In this depicted example, representative titanium phase diagram 900 is a pseudo-binary phase diagram. Representative titanium phase diagram 900 has x-axis 902, which represents percent beta titanium stabilizer, and y-axis 904, which represents temperature.

In representative titanium phase diagram 900, regions are identified where various phases are found at equilibrium as a function of temperature and composition. These regions may be single phase regions or dual phase regions. For example, an alpha phase region and a beta phase region may be single phase regions. An alpha plus beta phase region may be a dual phase region. In representative titanium phase diagram 900, the regions for the alpha phase and beta phase of titanium alloys are identified.

For example, alpha phase region 906, beta phase region 908, and alpha plus beta phase region 910 are present in representative titanium phase diagram 900. Alpha phase region 906 and beta phase region 908 are regions with single phases, while alpha plus beta phase region 910 is a region with a mixture of alpha phase and beta phase. These different regions are separated by lines 912 and 914. The temperatures along line 914 are referred to as beta transus temperatures.

In these examples, titanium alloy 310 in FIG. 3 may exist in different phases in representative titanium phase diagram 900, depending on the percent beta stabilizer used and/or the temperature of titanium alloy 310.

Foe a specific composition, beta transus point 915 on line 914 represents a beta transus or transformation temperature for that composition. This point represents the lowest temperature at which a 100 percent beta phase may exist at equilibrium for titanium alloy 310. A temperature below beta transus point 915 on line 914 may result in titanium alloy 310 becoming a dual phase region, such as alpha plus beta phase region 910. In a similar fashion, for a specific composition, a corresponding point on line 912 delineates the highest temperature at which titanium alloy 310 may exist entirely in alpha phase 906. At temperatures higher than this point on line 912, the titanium alloy may enter alpha plus beta phase region 910.

The predominant phase may be used to characterize types of titanium alloy 310. For example, without limitation, an alpha phase titanium alloy is weldable and has desired elevated temperature strength. An alpha plus beta phase titanium alloy combines moderate strength with improved toughness. A metastable beta phase titanium alloy may have a higher tensile strength than other forms of titanium through its ability to be precipitation hardened.

The percent beta stabilizer in x-axis 902 represents elements that may be added that may stabilize the beta phase of titanium alloy 310. In other words, the addition of a beta stabilizer lowers the temperature at which titanium alloy 310 may exist in the beta phase.

In the different advantageous embodiments, titanium alloy 310 may be processed in different regions in representative titanium phase diagram 900. For example, without limitation, titanium alloy 310 may be Ti-5Al-5V-5Mo-3Cr having stabilizer contents of V, Mo, and Cr at point 916.

In this illustrative example, titanium alloy 310 is forged in beta phase region 908 at point 918 (operation 930). Point 918 may be at an elevated temperature of around 1700 degrees Fahrenheit. During forging, a desired microstructure in titanium alloy 310 may be obtained by maintaining the temperature at a desired point to obtain a desired alpha plus beta microstructure.

Additionally, reduction deformation from around 20 percent to around 30 percent also may occur using a forging hammer and/or press die to aid in obtaining the desired microstructure. The deformation causes a re-crystallization process that may result in a fine and/or smaller grained two-phase microstructure. Forging in the dual phase alpha plus beta phase region may restrain grain growth after re-crystallization to yield a smaller grain size. Thereafter, additional forging of titanium alloy 310 is performed in alpha plus beta phase region 910 at point 920 (operation 932). Point 920 may be at an elevated temperature of around 1600 degrees Fahrenheit.

Heat treating of titanium alloy 310 is then performed in beta phase region 908 at point 918 (operation 934). Thereafter, final forging of titanium alloy 310 is performed in alpha plus beta phase region 910 at point 920 (operation 936). Thereafter, solution heat treatment is performed at point 918 (operation 938), followed by rapid air cooling in beta phase region 908 to a room temperature (operation 938).

In these examples, the room temperature may be a temperature at which the part may be physically handled. The room temperature may a temperature between around 50 degrees and 150 degrees Fahrenheit. In some advantageous embodiments, the cooling of titanium alloy 310 may be performed by water quenching rather than air cooling to create a supersaturated metastable beta phase at room temperature.

Ageing is then performed to transform the retained beta phase into the alpha and beta phases in alpha plus beta phase region 910 at point 922 (operation 940). Point 922 may be at a temperature between around 900 degrees to around 1,050 degrees Fahrenheit. The ageing heat treatment in operation 940 is performed to generate desired characteristics for titanium alloy 310. In operation 940, this heat treatment is performed using inverse gradient heat treatment system 334.

Inverse gradient heat treatment system 334 heats titanium alloy 310 to the desired temperature within alpha plus beta region 910. The interior section of titanium alloy 310 may be allowed to attain a temperature from around 1,000 degrees Fahrenheit to around 1,100 degrees Fahrenheit. This temperature provides a lower mechanical strength but higher toughness. The surface of titanium alloy 310 is cooled with inert gas 358.

This cooling allows the surface of titanium alloy 310 to be held at a lower temperature. This lower temperature may be from around 800 degrees Fahrenheit to around 900 degrees Fahrenheit. This temperature provides a finer precipitation of alpha phase particles in the beta phase. This type of processing results in higher mechanical strength and/or higher wear resistance.

Figure 10:
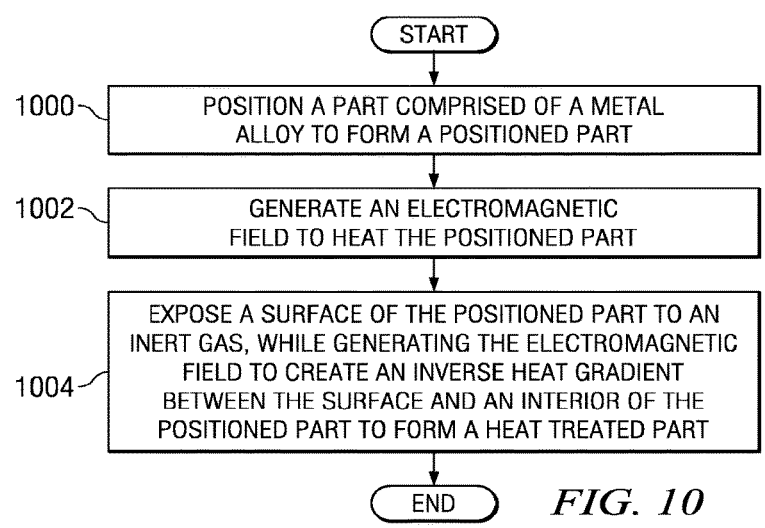
FIG. 10 is a flowchart of a process for manufacturing a part in accordance with an advantageous embodiment.

With reference now to FIG. 10, a flowchart of a process for manufacturing a part is depicted in accordance with an advantageous embodiment. The process illustrated in FIG. 10 may be implemented using a manufacturing environment such as, for example, manufacturing environment 300 in FIG. 3.

The process begins by positioning part 326 comprised of metal alloy 302 to form positioned part 366 (operation 1000). Thereafter, electromagnetic field 346 is generated to heat positioned part 366 (operation 1002). Surface 370 of positioned part 366 is exposed to inert gas 358, while generating electromagnetic field 346 to create inverse thermal gradient 376 between surface 370 and interior 368 of positioned part 366 to form heat treated part 378 (operation 1004), with the process terminating thereafter. In these illustrative examples, surface 370 is continuously exposed to inert gas 358 while electromagnetic field 346 is generated. Heat treated part 378 has different microstructures and/or mechanical properties between the exterior and interior sections.

Figure 11:
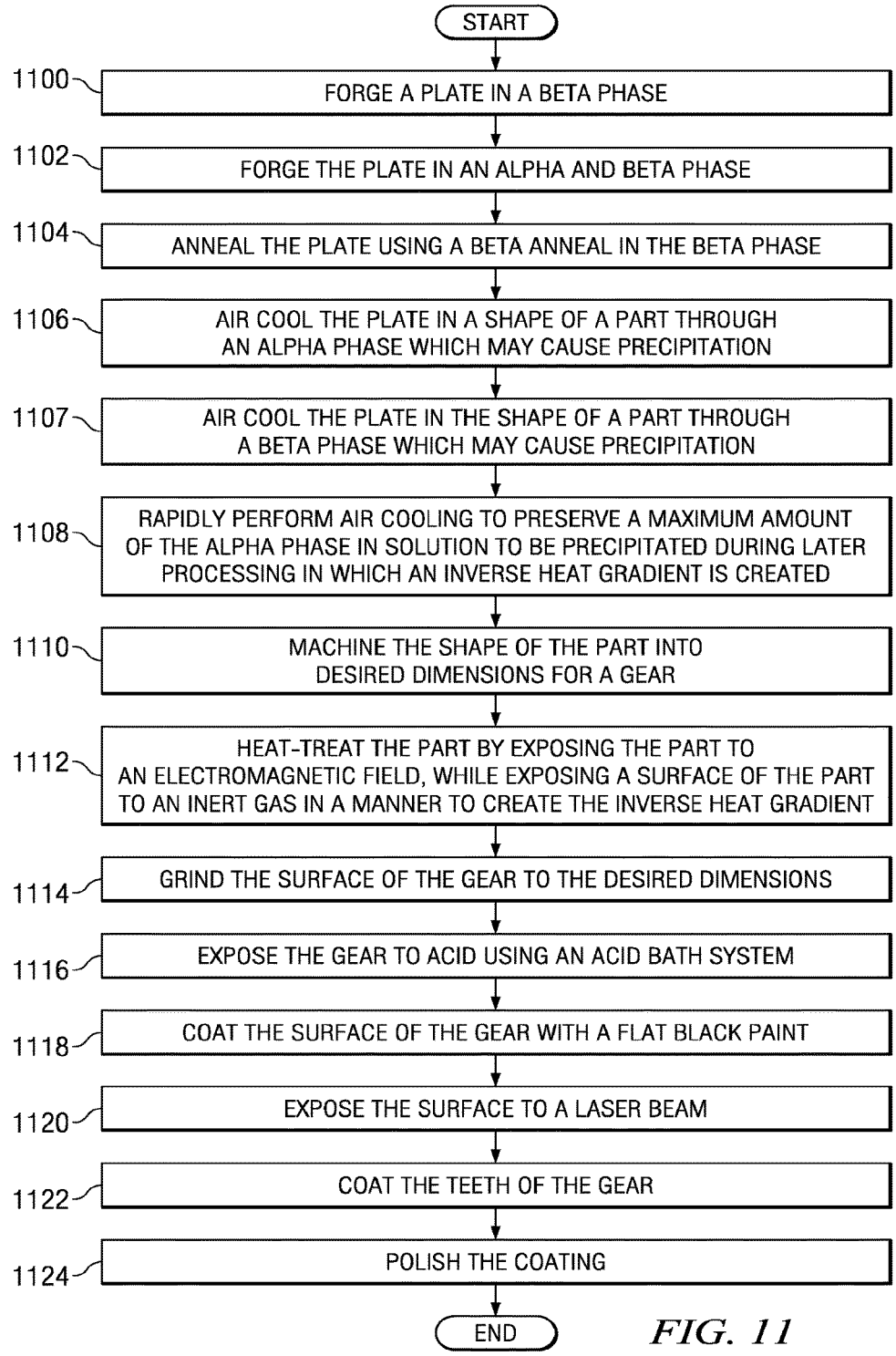
FIG. 11 is a flowchart of a process for manufacturing a part in the form of a gear in accordance with an advantageous embodiment.

With reference now to FIG. 11, a flowchart of a process for manufacturing a part in the form of a gear is depicted in accordance with an advantageous embodiment. The process illustrated in FIG. 11 may be implemented using a manufacturing environment such as, for example, without limitation, manufacturing environment 300 in FIG. 3.

The process begins by forging plate 316 in beta phase region 1008 (operation 1100). Thereafter, the process forges plate 316 in alpha plus beta region 1010 (operation 1102).

In this illustrative example, plate 316 may take the form of a 15 inch by 15 inch by 3 inch plate comprised of Ti-5Al-5V-5Mo-3Cr.

Plate 316 is heat treated using a beta anneal in beta phase region 1008 (operation 1104). In operation 1104, the heat treatment may be performed by increasing the temperature of plate 316 into beta phase region 1008. In these examples, a beta anneal may be performed at a temperature that is greater than 1,450 degrees Fahrenheit. Thereafter, plate 316 in shape 324 of part 326 is air cooled through alpha phase region 1006, which causes precipitation (operation 1106).

Plate 316 in shape 324 of part 326 is air cooled through beta phase 1006, which cause precipitation (operation 1107). Alpha plus beta region 1010 is where the alpha phase particles of metal alloy 302 may precipitate out within a beta phase of metal alloy 302. As the temperature is lowered, more alpha phase particles precipitate because of more rapid nucleation that occurs at the lower temperature coupled with slow diffusion driven growth. The precipitate is smaller in diameter.

Metal alloy 302 is air quenched to prevent alpha phase particles from precipitating when metal alloy 302 is cooled from beta phase solution heat treat anneal that occurs at the conclusion of the forging process. The air quenching is performed at a cooling rate which allows no time for nucleation of the precipitate. These particles are retained in metastable solution in the beta phase of metal alloy 302 so the elements can be precipitated during subsequent processing. A larger increase in mechanical properties results during the second precipitation heat treatment that follows. In these examples, alpha phase 1006 may be reached at a temperature below around 800 degrees Fahrenheit.

Operations 1100 through 1107 are performed to achieve higher minimum fracture toughness in the core of part 326. The air cooling is performed rapidly to preserve the maximum amount of alpha phase in solution to be precipitated during later processing in which inverse thermal gradient 376 is created (operation 1108). In these examples, metal alloy 302 may be partitioned into aluminum-rich and molybdenum, iron, chromium, vanadium-rich regions. The aluminum-rich regions in metal alloy 302 precipitate an alpha phase particle with a hexagonal close packed crystal structure, while the vanadium, iron chromium, and molybdenum-rich region remain a body-centered cubic crystal structure beta phase.

Metal alloy 302 is referred to as metastable beta after solution heat treatment and rapid cooling because metal alloy 302 has an all beta titanium body centered cubic crystal structure. At room temperature, beta phase 1008 is thermodynamically the most stable state of this composition, which is alpha plus beta region 1010. The term "rapidly" refers to the rate of cooling in degrees Fahrenheit per second that metal alloy 302 may be subjected to prevent nucleation of the alpha phase in cooling from the beta solution anneal to room temperature. The rate needed to suppress nucleation translates into cooling media with different convective heat transfer coefficients to provide the necessary cooling rate.

Ranking these cooling media in order of their convection heat transfer coefficients is as follows: still air natural convection, forced air convection, salt bath quench, water bath quench, and brine bath quench. Metal alloys, such as 10V-2Fe-3Cr, may require a more severe water quench to suppress the nucleation of its alpha phase, while 5Mo-5Al-5V-3Cr only requires an air quench.

The process machines shape 324 of part 326 into desired dimensions for gear 328 (operation 1110). Thereafter, the process heats treat part 326 by exposing part 326 to electromagnetic field 346, while exposing surface 370 of part 326 to inert gas 358 in a manner to create inverse thermal gradient 376 (operation 1112). In this operation, the inert gas may take the form of argon. Operation 1110 causes alpha phase precipitation hardening. In these illustrative examples, gear 328 has H900 properties on surface 370 and H1050 properties in interior 368 of gear 328.

Surface 370 of gear 328 is ground to desired dimensions (operation 1114). Operation 1114 may generate finer shapes and/or tolerances as compared to the machining performed in operation 1110. In these examples, the grinding is performed on the teeth of gear 328. The process then exposes gear 328 to acid 388 using acid bath system 384 (operation 1116). This operation removes metal damage to gear 328 that may be caused during grinding in operation 1112. Further, this operation also removes oxidation scale and alpha case left from the heat treatment performed in operation 1110.

In these examples, the acid may be, for example, nitric acid ($HNO_3$) and/or hydrofluoric (HF) acid which is used to remove any detrimental alpha case or oxide scale created during heat treatment due to impure inert gas. At temperatures above 700 degrees Fahrenheit, a titanium alloy may react increasingly rapidly with oxygen impurities in the inert gas to dissolve oxygen atoms within titanium alloy's lattice in a manner that may stabilize a brittle hexagonal close packed alpha phase of the titanium alloy on the surface called alpha case. Alternatively, the titanium alloy may react increasingly rapidly with oxygen impurities in the inert gas in a manner such that if the oxygen in the environment is relatively plentiful, a gray oxide ($TiO_2$) scale may form on the surface.

The oxygen in the environment is considered relatively plentiful when air in a furnace is present. The brittle alpha (oxygen rich) phase of the titanium alloy forms on the surface in both cases. If this phase of the titanium alloy is not removed from the surface, the ductility and the fracture toughness of the component may suffer.

The scale and alpha phase is removed by dissolving the scale and alpha phase in an acid bath. This acid bath is dilute in concentration such that the scale and alpha phase can be removed. In these examples, the acid may be, for example, nitric acid ($HNO_3$) and/or hydrofluoric (HF) acid.

The process then coats surface 370 of gear 328 with flat black paint 391 (operation 1118). The process then exposes surface 370 to laser beam 392 (operation 1120). Operation 1120 is performed to place surface 370 into a compressive residual stress such as, for example, without limitation, compressive stress 393. This compressive residual stress may reduce and/or prevent fatigue that may be caused by contact with another gear. In these illustrative examples, performing laser shock peening may provide a compressive residual stress of around 180 KSI.

The process then coats the teeth of gear 328 with coating 396 (operation 1122). Coating 396 is also referred to as a wear coating and may be, for example, without limitation, physical vapor deposition titanium nitride, plated nickel carbide, and/or high velocity oxygen fuel deposited tungsten carbide-cobalt. This operation may be used with a high velocity oxygen fuel tungsten carbide-cobalt coating.

The process then polishes coating 396 (operation 1124), with the process terminating thereafter.

The different operations illustrated in FIGS. 10 and 11 are not meant to imply limitations to the manner in which different advantageous embodiments may be implemented. The flowcharts and block diagrams in the different depicted embodiments illustrate the architecture, functionality, and operation of some possible implementations of apparatus and methods. In this regard, each block in the flowchart or block diagrams may represent a module, segment, or portion, which comprises one or more executable operations for implementing the specified function or functions.

In some alternative implementations, the function or functions noted in the blocks may occur out of the order noted in the figures. For example, in some cases, two blocks shown in succession may be executed substantially concurrently, or the blocks may sometimes be executed in the reverse order, depending upon the functionality involved.

For example, in some advantageous embodiments, polishing may be unnecessary, depending on the type of coating. In yet other advantageous embodiments, forging operations may be unnecessary if the part has already been partially processed, such as with the use of nickel base or pH stainless powder compacts for certain less critical applications.

As yet another example, in other advantageous embodiments, compressive residual stress may be placed on the surface of the part using other mechanisms other than laser shock peening. For example, without limitation, any process that may place a surface of a component into residual compression may be used. For example, without limitation, burnishing the surface with a machine tool also may be used instead of laser shock peening.

The description of the different advantageous embodiments has been presented for purposes of illustration and description, and it is not intended to be exhaustive or limited to the embodiments in the form disclosed. Many modifications and variations will be apparent to those of ordinary skill in the art. Although the different advantageous embodiments have been described with respect to manufacturing a gear, the different advantageous embodiments may be applied to manufacturing other types of parts.

Other types of parts include, for example, without limitation, a shaft, a crankshaft, a valve, a cam, a camshaft, a propeller, a flywheel, and/or some other suitable part. Further, the different advantageous embodiments have been described with respect to manufacturing parts for an aircraft, such as a helicopter. The different advantageous embodiments may be applied to other types of objects other than aircraft.

For example, the different advantageous embodiments may be applied to objects such as, for example, without limitation, a mobile platform, a stationary platform, a land-based structure, an aquatic-based structure, a space-based structure, an aircraft, a helicopter, a surface ship, a tank, a personnel carrier, a train, a spacecraft, a submarine, a bus, a car, a race car, a race boat, a machine press, a transmission, a dam, a manufacturing facility, and/or some other suitable object.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
    a chamber configured to hold a spur gear comprising a cylindrical portion and teeth radially extending from the cylindrical portion;
    an induction coil configured to generate an electromagnetic field located in the chamber; and
    a gas delivery system with a cooling ring manifold comprising a plurality of jets arranged radially around a central axis of the spur gear and directed at the teeth and dedendum circle of the spur gear, the gas delivery system configured to continuously deliver an inert gas from the chamber onto the teeth and a dedendum circle of the spur gear to cool the teeth of the spur gear, wherein the cylindrical portion of the spur gear within a root diameter of the spur gear is allowed to heat via induction heating created by the electromagnetic field thereby establishing an inverse thermal gradient through the spur gear.

2. The apparatus of claim 1 further comprising:
a power unit configured to generate a current that causes the induction coil to generate the electromagnetic field at a frequency configured to create eddy currents an interior section of the spur gear.

3. The apparatus of claim 1, wherein the chamber comprises a circular chamber.

4. The apparatus of claim 3, wherein the chamber further comprises a part holder configured to hold the spur gear.

5. The apparatus of claim 1, wherein the induction coil is configured to generate different eddy currents in the spur gear.

6. The apparatus of claim 1 further comprising:
a forge configured to forge a plate of metal into the spur gear.

7. The apparatus of claim 6, wherein the forge is further configured to forge the plate in a beta phase region.

8. The apparatus of claim 7, wherein the forge is further configured to forge the plate into an alpha plus beta phase region after forging the spur gear in the beta phase region.

9. The apparatus of claim 8 further comprising:
a solution heat treatment device configured to solution heat treat the spur gear in the beta phase after forging the spur gear.

10. The apparatus of claim 1 further comprising:
a cooling station configured to quench the spur gear after forging rapidly enough to prevent alpha precipitation from occurring.

11. The apparatus of claim 10 wherein the cooling station is an air cooling station.

12. The apparatus of claim 10 wherein the cooling station is a water cooling station.

13. The apparatus of claim 1 further comprising:
a machining station configured to machine the spur gear.

14. The apparatus of claim 1 further comprising:
a grinding station configured to grind the spur gear after heat treatment.

15. The apparatus of claim 1 further comprising:
a compression station configured to place the spur gear into compressive stress after heat treatment.

16. The apparatus of claim 1 further comprising:
a peening station configured to perform laser shock peening on a surface of the spur gear.

17. The apparatus of claim 1 further comprising:
a coating station configured to deposit a coating on a surface of the spur gear.

18. The apparatus of claim 17, wherein the coating comprises a material selected from one of physical vapor deposition titanium nitride, plated nickel carbide, and high velocity oxygen fuel deposited tungsten carbide—cobalt.

19. The apparatus of claim 17 further comprising:
a polishing station configured to polish a surface of the spur gear with the coating.

20. The apparatus of claim 1, wherein establishing an inverse thermal gradient through the spur gear comprises creating an inverse thermal gradient between an exterior of the spur gear and an interior section of the spur gear to form a heat treated gear.

21. The apparatus of claim 1, wherein inverse thermal gradient comprises an increasing temperature farther into an interior of the spur gear as compared to a surface of the spur gear.

22. The apparatus of claim 21, wherein a temperature of the interior of the spur gear is between around 1,000 degrees Fahrenheit and around 1,100 degrees Fahrenheit and wherein a temperature of the surface of the spur gear is between around 800 degrees Fahrenheit and around 900 degrees Fahrenheit.

\* \* \* \* \*